(12) United States Patent
Tsuchiya (10) Patent No.: US 8,643,133 B2
(45) Date of Patent: Feb. 4, 2014

(54) THERMAL DETECTOR, THERMAL DETECTION DEVICE, AND ELECTRONIC INSTRUMENT

(75) Inventor: Yasushi Tsuchiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 29 days.

(21) Appl. No.: 13/399,224

(22) Filed: Feb. 17, 2012

(65) Prior Publication Data
US 2012/0211858 A1 Aug. 23, 2012

(30) Foreign Application Priority Data

Feb. 23, 2011 (JP) .................................. 2011-036817

(51) Int. Cl.
*H01L 31/058* (2006.01)
(52) U.S. Cl.
USPC ................. 257/470; 257/E31.054; 250/338.4
(58) Field of Classification Search
USPC .......................... 257/470, E31.054; 250/338.4
See application file for complete search history.

(56) References Cited

U.S. PATENT DOCUMENTS

| | | | |
|---|---|---|---|
| 6,034,369 A * | 3/2000 | Oda ............................ | 250/338.1 |
| 6,495,829 B1 | 12/2002 | Oda | |
| 6,985,116 B2 * | 1/2006 | Agnese et al. ................ | 343/703 |
| 7,638,769 B2 * | 12/2009 | Honda et al. ............... | 250/338.4 |
| 8,465,202 B2 * | 6/2013 | Kaess et al. ................... | 374/121 |
| 2006/0016995 A1 * | 1/2006 | Kummer et al. ............ | 250/338.1 |
| 2009/0015491 A1 * | 1/2009 | Ikeda et al. .................... | 343/703 |
| 2010/0213374 A1 * | 8/2010 | Meinel et al. ............... | 250/338.4 |
| 2011/0147869 A1 * | 6/2011 | Lazarov et al. ............... | 257/432 |
| 2011/0180712 A1 * | 7/2011 | Murakami .................. | 250/338.4 |

FOREIGN PATENT DOCUMENTS

| | | |
|---|---|---|
| JP | 06-229821 A | 8/1994 |
| JP | 07-190854 A | 7/1995 |
| JP | 2000-205944 A | 7/2000 |
| JP | 2002-113700 A | 4/2002 |
| JP | 2003-304005 A | 10/2003 |

OTHER PUBLICATIONS

Kerwin Wang, Karl F. Bohringer; "Time-multiplexed-plasma-etching of High Numerical Aperture Paraboloidal Micromirror Arrays"; The 5th Pacific Rim Conference on Lasers and Electro-Optics, Tiapei, Taiwan, Jul. 22-26, 2003; postponed to Dec. 2003.

* cited by examiner

*Primary Examiner* — Steven J Fulk
(74) *Attorney, Agent, or Firm* — Global IP Counselors, LLP (57) ABSTRACT

A thermal detector includes a substrate, a thermal detection element and a support member. The substrate has a recess part with a bottom surface of the recess part being a curved light-reflecting surface. The thermal detection element has a light-absorbing film. The support member supports the thermal detection element. The substrate and the support member are arranged to form a hollow part therebetween. The support member includes a light-absorbing part in which impurities are dispersed in polycrystalline silicon with the light-absorbing part being arranged in at least a part of a surface of the support member facing toward the hollow part so that the light-absorbing part being irradiated by light.

7 Claims, 9 Drawing Sheets

Fig. 11

THERMAL DETECTOR, THERMAL DETECTION DEVICE, AND ELECTRONIC INSTRUMENT

CROSS-REFERENCE TO RELATED APPLICATIONS

This application claims priority to Japanese Patent Application No. 2011-036817 filed on Feb. 23, 2011. The entire disclosure of Japanese Patent Application No. 2011-036817 is hereby incorporated herein by reference.

BACKGROUND

1. Technical Field

The present invention relates to a thermal detector, a thermal detection device, and an electronic instrument.

2. Related Art

Pyroelectric-type and bolometer-type infrared light detection devices are known thermal detection devices. Infrared light detection devices detect infrared light based on the heat that is produced when an infrared light-absorbing film absorbs infrared light, causing an excitation voltage to be produced in the detection element (pyroelectric-type) or causing a resistance value to change (bolometer-type).

In order to improve sensitivity by increasing infrared light absorption, it has been proposed that the diaphragm that constitutes the infrared light absorbing film be supported on a substrate via a hollow part, where the distance between the infrared light absorbing film and the completely reflective film that is formed on the substrate adjacent to the hollow part is set at $\lambda/4n$ ($\lambda$: infrared light wavelength, n: integer) (see, Japanese Laid-Open Patent Application Publication No. 2000-205944 (FIGS. 2, 3)).

In addition, in order to improve sensitivity by increasing infrared light absorption, a structure has been proposed wherein a plurality of upper infrared light-absorbing layers are disposed, with spatial separation, on a lower infrared light-absorbing layer, with respective reflecting films formed on the upper and lower infrared light-absorbing layers (see, Japanese Laid-Open Patent Application Publication No. 2003-304005 (FIG. 2)).

Moreover, in order to increase detection sensitivity by decreasing loss due to reflection at the infrared light film, it has been proposed that a first infrared light absorbing film be formed on the side surfaces of a V-shaped recess part, and that a second infrared light absorbing film be formed on the bottom surface thereof, so that infrared light that is reflected by one of the first and second infrared light absorbing films is directed to the other infrared light absorbing film (see, Japanese Laid-Open Patent Application Publication No. 07-190854 (FIG. 2)). In patent document 3, the angle of inclination of the V-shaped recess is set so that there are a total of three reflections at the first and second infrared light absorbing films, thereby increasing the number of times the light is incident on the infrared light absorbing film, thus increasing absorption.

SUMMARY

In Japanese Laid-Open Patent Application Publication No. 2000-205944, the respective energy intensities of the first reflected infrared light that is reflected by the infrared light absorbing film and the second reflected light that is reflected by the completely reflective film are different, and so it is not possible to completely cancel out interactions between the first reflected infrared light and the second reflected infrared light. As a result, there is the problem that the effective absorption at the infrared light absorbing film is not high. In Japanese Laid-Open Patent Application Publication No. 2003-304005, mismatching arises in the respective patterning of the plurality of upper infrared light absorbing layers and the lower infrared light absorbing layer. For this reason, there is the problem that it is difficult to reduce element size and to increase detail when arranging elements in a two-dimensional array. In Japanese Laid-Open Patent Application Publication No. 07-190854, it is difficult to process the material to produce a deep V-shaped recess that reflects a total of three times. In addition, as with Japanese Laid-Open Patent Application Publication No. 2003-304005, mismatching arises in the respective patterns of the first and second infrared light absorbing films in Japanese Laid-Open Patent Application Publication No. 07-190854. For this reason, there is the problem that it is difficult to reduce element size and to increase detail when arranging elements in a two-dimensional array.

There is accordingly a desire for a thermal detector, a thermal detection device, and an electronic instrument whereby light that has not been absorbed by the light-absorbing film is efficiently reflected and conducted to the light absorbing film, thereby increasing detection sensitivity.

The present invention was developed in order to resolve at least some of the problems described above and can be realized in the modes and aspects described below.

A thermal detector according to a first aspect of the present invention includes a substrate, a thermal detection element and a support member. The substrate has a recess part with a bottom surface of the recess part being a curved light-reflecting surface. The thermal detection element has a light-absorbing film. The support member supports the thermal detection element. The substrate and the support member are arranged to form a hollow part therebetween. The support member includes a light-absorbing part in which impurities are dispersed in polycrystalline silicon with the light-absorbing part being arranged in at least a part of a surface of the support member facing toward the hollow part so that the light-absorbing part being irradiated by light.

In this aspect, the light-absorbing film absorbs light, and the absorbed light heats the light-absorbing film. The thermal detection element then generates an excitation voltage as a result of the heat. The heat causes a change in resistance value (or charge due to spontaneous polarization in accordance with temperature), and the thermal detection element can thus detect the light based on the generated heat. At this time, there is thermal isolation between the substrate and the thermal detection element, because a hollow part is provided between the support member that carries the thermal-type light-detecting element and the substrate having high heat capacity. Consequently, detection is possible with little heat loss.

Infrared light that is incident on the thermal detector includes infrared light that has passed through the light-absorbing film and infrared light that has not been directly incident on the light-absorbing film. The light that has not been absorbed in the light-absorbing film shines on the curved light-reflecting surface on the substrate side via the hollow part. This light is reflected at the curved light-reflecting surface and shines on the support member via the hollow part from the side opposite from the direction of incidence. The hollow part has the function of both thermal isolation and a light conduction path. A light-absorbing part in which impurities are dispersed in polycrystalline silicon is present in at least part of the support member, and light absorption is increased in the light-absorbing part. As a result, the amount of light that is absorbed in the light-absorbing part of the support member is increased, thereby increasing the amount of heat generated by the incident light and allowing the detection sensitivity of the thermal detector to be increased.

The light-absorbing part described in the above aspect preferably has a pattern including a doped region in which the impurities are dispersed in the polycrystalline silicon and an undoped region that is free from impurities.

In this aspect, the pattern has doped regions and undoped regions. In the doped regions of the light-absorbing part in which impurities have been dispersed in the polycrystalline silicon, the light absorption is high and the thermal conductivity is low. In the undoped regions that do not contain impurities, on the other hand, light absorption is low and the thermal conductivity is high. It is thus possible to bring about light absorption in the doped region and to bring about conveyance of heat to the thermal-type light detecting element in the undoped region. As a result, the heat that has been generated in the doped region is efficiently conveyed to the thermal-type light detecting element, allowing an increase in the detection sensitivity of the thermal detector.

The curved light-reflecting surface described in the above aspect is preferably a spherical surface, a parabolic surface, or a curved surface that is closer to the parabolic surface than the spherical surface.

In accordance with this aspect, the curved light-reflecting surface is a spherical surface, a parabolic surface, or a curved surface that is closer to a parabolic surface than a spherical surface. Light that has been reflected by a parabolic surface necessarily passes through a single point, which is the focal point, and light that has been reflected by a spherical surface passes through a region in the vicinity of a prescribed point. Consequently, it is possible to dispose the curved light-reflecting surface so that the reflected light coming from the side opposite the direction of light incidence passes through the light-absorbing part. As a result, the amount of light that is absorbed by the light-absorbing part of the support member is increased, thereby increasing the amount of heat generated by the incident light and allowing the detection sensitivity of the thermal detector to be increased.

A thermal detection device according to another aspect includes a plurality of the thermal detectors according to the above aspect arranged two-dimensionally in a grid-like pattern.

By disposing the thermal detectors in a two-dimensional grid in accordance with this aspect, a light distribution image can be detected by the thermal detection device.

An electronic instrument according to another aspect includes the thermal detection device according to the above described aspect.

In accordance with this aspect, the electronic instrument comprises the thermal detection device. This thermal detection device has high detection sensitivity, and the electronic instrument can output a light distribution image with good sensitivity.

BRIEF DESCRIPTION OF THE DRAWINGS

Referring now to the attached drawings which form a part of this original disclosure.

DETAILED DESCRIPTION OF EXEMPLARY EMBODIMENTS

Embodiments of the present invention are described below with reference to the drawings. In the respective drawings, the layers and members are altered from their actual dimensions in order to allow the respective layers and members to be more readily discerned.

Embodiment 1

Figure 1:
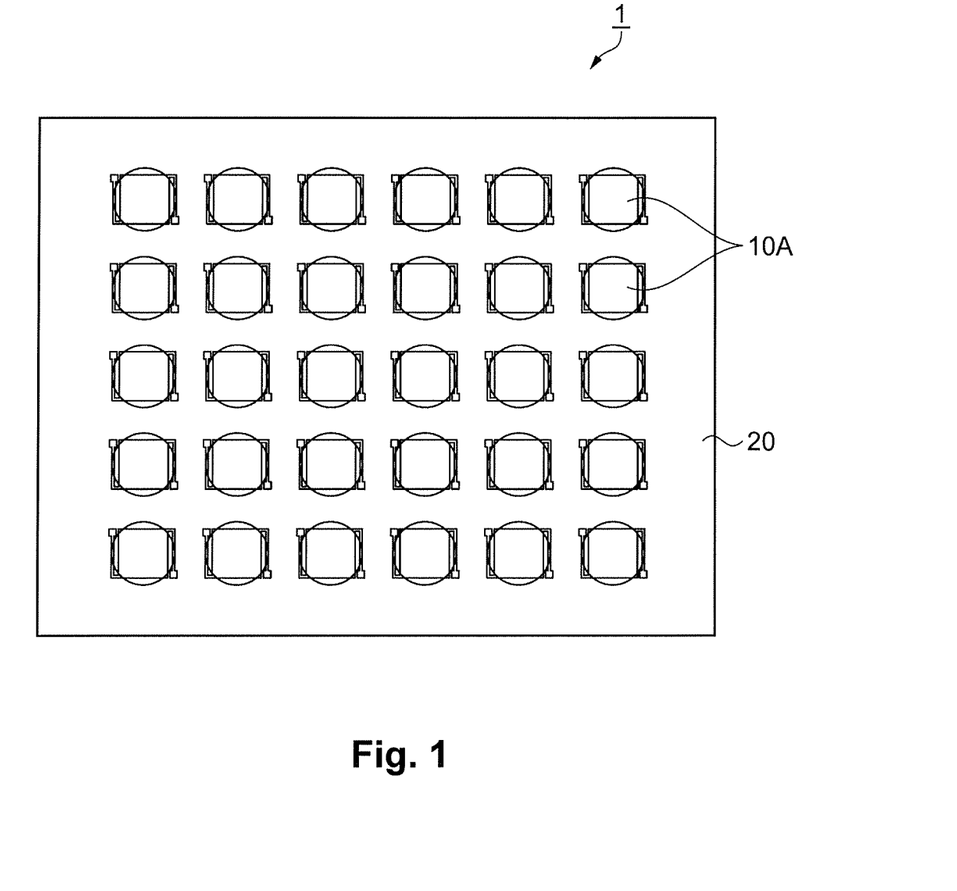
FIG. 1 is a schematic plan view showing the infrared detection device of Embodiment 1.

FIG. 1 is a schematic plan view showing an infrared detection device. As shown in FIG. 1, the infrared light detection device 1 has a substrate 20. Thermal detectors 10A are disposed as individual cells in a two-dimensional grid-shaped matrix on the substrate 20. Each cell denotes the section in which a thermal detector 10A has been disposed. The thermal detectors 10A detect infrared light and thus the infrared detection device 1 can detect an infrared light distribution. The infrared detection device 1 can thus provide a thermal (light) distribution image.

Figure 2A:
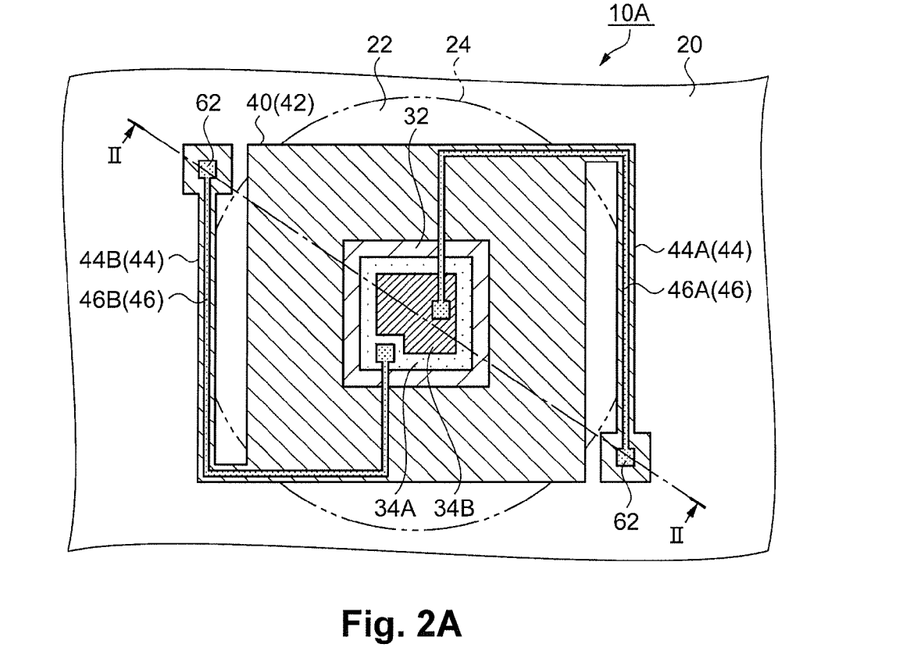
FIG. 2A is a schematic plan view showing the infrared detector.
Figure 2B:
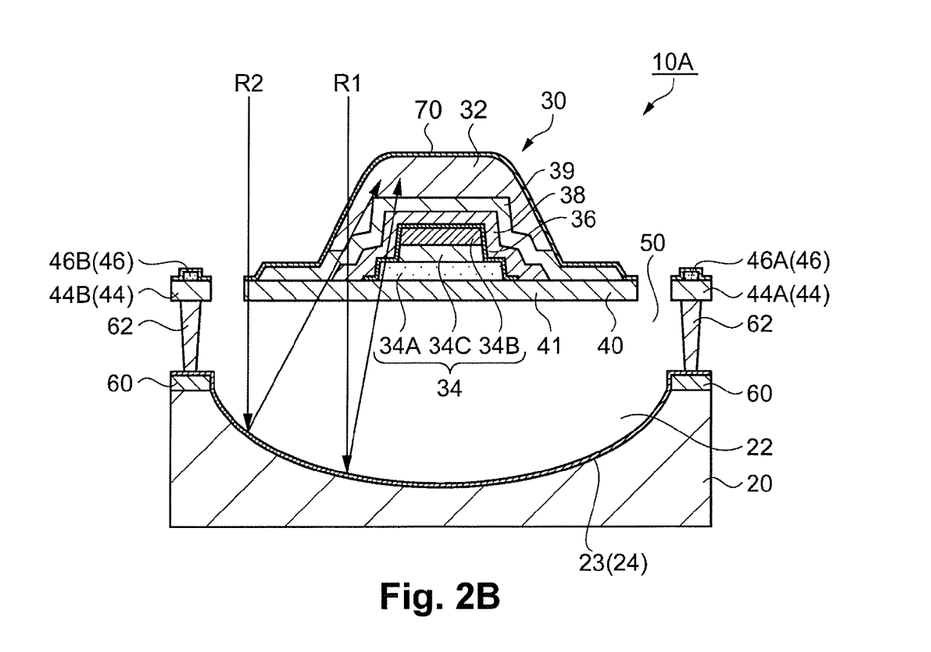
FIG. 2B is a schematic sectional view showing the infrared detector.

FIG. 2A is a schematic plan view that shows an infrared detector. FIG. 2B is a schematic sectional view of the infrared detector taken along the line II-II in FIG. 2A. First, the general configuration will be described for the thermal detector 10A that is used as the infrared detector in Embodiment 1.

As shown in FIGS. 2A and 2B, the thermal detector 10A has a second recess part 22 that is used as the recess part, and a substrate 20 is provided in which the bottom surface 23 of the second recess part 22 is the curved light-reflecting surface 24. In addition, the thermal detector 10A has a thermal detection element 30 (more broadly, a thermal detection element) in which is disposed a light-absorbing film 32 (more broadly, a light-absorbing film), and the thermal detection element 30 is installed on a sheet-form support member 40 (also referred to as "membrane"). The film having the highest absorption with respect to the target light to be detected among the films that constitute the thermal detection element 30 may be the light absorbing film 32. A hollow part 50 is provided between the substrate 20 and the support member 40.

In the plan view of the substrate 20, the curved light-reflecting surface 24 and the light-absorbing film 32 overlap, and the projected surface area as seen in a plan view of the curved light-reflecting surface 24 (the surface area within the circle denoted by the broken line in FIG. 2A) is formed so as to be larger than the light-absorbing film 32 (surface area of the square).

In this thermal detector 10A, incident infrared light is absorbed in the light-absorbing film 32, and the heat that is generated by the absorbed infrared light generates an excitation voltage in the thermal detection element 30, or causes a change in resistance value, thereby allowing the infrared light to be detected. A hollow part 50 is provided between the support member 40 that supports the thermal detection element 30 and the substrate 20 having high heat capacity. For this reason, the thermal detection element 30 and the substrate 20 are thermally isolated, and it is possible to detect infrared light without thermal loss. The hollow part 50 for the thermal detector 10A of one cell is a circular region shown in the second recess part 22. Although the size of the second recess part 22 is not restricted, in this embodiment, the diameter is 30 µm, for example.

The infrared light that is incident on the thermal detector 10A includes infrared light R1 that has passed through the light-absorbing film 32 and infrared light R2 that has not at all been incident on the light-absorbing film 32. The presence of infrared light R1 and R2 that has not been absorbed by the light-absorbing film 32 decreases the sensitivity of the thermal detector 10A.

Thus, of the directly-incident infrared light including infrared light R1 and R2, the infrared light that is not absorbed by the light-absorbing film 32 is reflected at the curved light-reflecting surface 24 of the substrate 20 via the hollow part 50. Thus, the curved light-reflecting surface 24 directs the infrared light R1 and R2 to the support member 40 via the hollow part 50 from the side opposite the infrared light incidence direction. The hollow part 50 can function as a light conduction path in addition to providing thermal separation of the support member 40 and the substrate 20. A light-absorbing part 41 in which impurities are dispersed in polycrystalline silicon is installed in at least part of the support member 40. Light absorption is increased in the light-absorbing part 41. The impurities are substances that disrupt the arrangement of the silicon crystals, examples of which are boron (B) and phosphorus (P). Infrared light R1 and R2 that has been reflected at the curved light-reflecting surface 24 shines on the light-absorbing part 41. In this manner, the infrared light R1, R2, . . . also is absorbed at the light-absorbing part 41 of the support member 40, thereby increasing the amount of heat generated from the incident light and allowing the detection sensitivity of the thermal detector 10A to be increased.

The light-absorbing part 41 preferably is directly below the thermal detection element 30. The infrared light that has been absorbed by the light-absorbing part 41 is converted to heat, and the heat can be thermally conducted to the infrared detecting element without excessive loss of heat, allowing an increase in the detection sensitivity at the thermal detector 10A.

Specifically, the support member 40 has a mounting member 42 on which the thermal detection element 30 is mounted and at least one arm 44, for example, a first arm 44A and a second arm 44B, having one end connected to the mounting member 42 and the other end supported on the substrate 20. The mounting member 42 and the arm 44 are formed from a material that is transmissive with respect to infrared light. A wiring layer 46 (46A, 46B) that connects with the thermal detection element 30 can be formed on the first arm 44A and second arm 44B. One arm 44 may be provided, and the wiring layers 46A and 46B may form the single arm 44.

The arm 44 (44A, 44B) may be disposed outside of the projected surface area of the curved light-reflecting surface 24 on the substrate 20 as seen in plan view. Moreover, a large portion may be disposed inside the projected surface area of the curved light-reflecting surface 24 on the substrate 20 as seen in plan view. As a result, the surface area occupied by the thermal detector 10A in a single cell can be decreased.

When the wiring layer 46 (46A, 46B) that is formed on the arm 44 (44A, 44B) is made from metal, the metal will reflect infrared light, thereby shielding the infrared light that is directed towards the curved light-reflecting surface 24. Thus, the material used for forming the wiring layers 46A, 46B may be formed from a material that is transmissive with respect to infrared light (more broadly, incident light). The material for the wiring layers 46A, 46B has no particular restrictions, and, for example, a transparent electrode material (ITO) or the like may be used. When this is done, the surface area occupied by the thermal detector 10A of a single cell can be decreased while also increasing detection sensitivity by reducing loss in the wiring layer 46 (46A, 46B).

In order to thermally isolate the substrate 20 and the support member 40, two posts 62 are erected towards the mounting member 42 of the substrate 20, interposed by a spacer layer 60. The first arm 44A and the second arm 44B are supported on the two posts 62. In this manner, it is possible to use the region that includes the area between the substrate 20 and the support member 40 produced by the spacer layer 60 and the post 62 as the hollow part 50. The support member 40 is supported on the substrate 20 via the posts 62, which are of a small volume, and thermal conduction across the thermal transfer pathway that runs from the support member 40 to the substrate 20 is decreased. Consequently, the thermal detector 10A decreases dissipation of heat from the thermal detection element 30, including the light-absorbing film 32.

The spacer layer 60 and the post 62 define the height of the hollow part 50 for conducting light reflected at the curved light-reflecting surface 24 to the support member 40. The spacer layer 60 is not necessarily required, and only the post 62 may be provided.

With a bolometer-type device in which the thermal detection element 30 is a thermal detection element, a resistor layer is formed. In this embodiment, the thermal detection element 30 is a pyroelectric-type photodetecting element, and the thermal detection element 30 includes a capacitor 34.

The capacitor 34 has a first electrode 34A ("lower electrode") that is mounted on the mounting member 42 and a second electrode 34B (referred to as "upper electrode") that is disposed opposite the first electrode 34A. The capacitor 34 also includes a ferroelectric film 34C that is used as pyroelectric material that is disposed between the first electrode 34A and the second electrode 34B. The first electrode 34A is connected to the wiring layer 46B, and the second electrode 34B is connected to the wiring layer 46A. The capacitor 34 undergoes spontaneous polarization due to the heat generated by the infrared light, and a charge is taken off as a result of this spontaneous polarization, so that the infrared light can be detected. The method for detecting infrared light, for example, is a method in which the infrared light is cut with a mechanical chopper and output is obtained through an alternating electrical polarization phenomenon. Alternately, a voltage of a polarity that draws surface charge is applied in the direction of spontaneous polarization, and the voltage of the capacitor terminals is detected that varies in accordance with charge that is drawn subsequent to turning off the applied voltage.

The side surfaces and the top surface of the capacitor 34 can be covered with an electrically insulating film 38 and a hydrogen barrier film 36 in order to prevent degradation due to reduction of the ferroelectric film 34C. Moreover, a protective film 39 that covers the electrically insulating film 38 can be disposed. The protective film 39 is a film that is disposed in order to protect the capacitor 34 when forming the light-absorbing film 32. The light-absorbing film 32 is formed covering the protective film 39. The surface side of the thermal detector 10A that includes the light-absorbing film 32, the support member 40 and the wiring layer 46 is covered by an upper protective film 70 that functions as a mask layer when forming the hollow part 50 by etching.

When the bottom surface 23 of the second recess part 22 is a parabolic surface, light that is incident on the parabolic surface is reflected towards a single point (focal point), and so the bottom surface 23 of the second recess part 22 is ideally a parabolic surface. However, when the second recess part 22 is formed by isotropically etching the substrate 20 as described below, it is difficult to process the bottom surface 23 of the second recess part 22 to produce a truly parabolic surface, and so the bottom surface 23 of the second recess part 22 may have a parabolic surface at least in part. The focal point of the parabolic surface is preferably located inside of the light-absorbing part 41. The light that is incident on the light-absorbing part 41 can be efficiently converted to heat, thereby allowing the detection sensitivity of the thermal detector 10A to be increased.

The substrate 20 is preferably a material that is suitable for isotropic etching and reflects infrared light. In this embodiment, this material is a silicon substrate. The bottom surface 23 of the second recess part 22 of the substrate 20 can be the curved light-reflecting surface 24 that reflects infrared light.

Thermal-Type Detector Manufacturing Method

Figure 3:
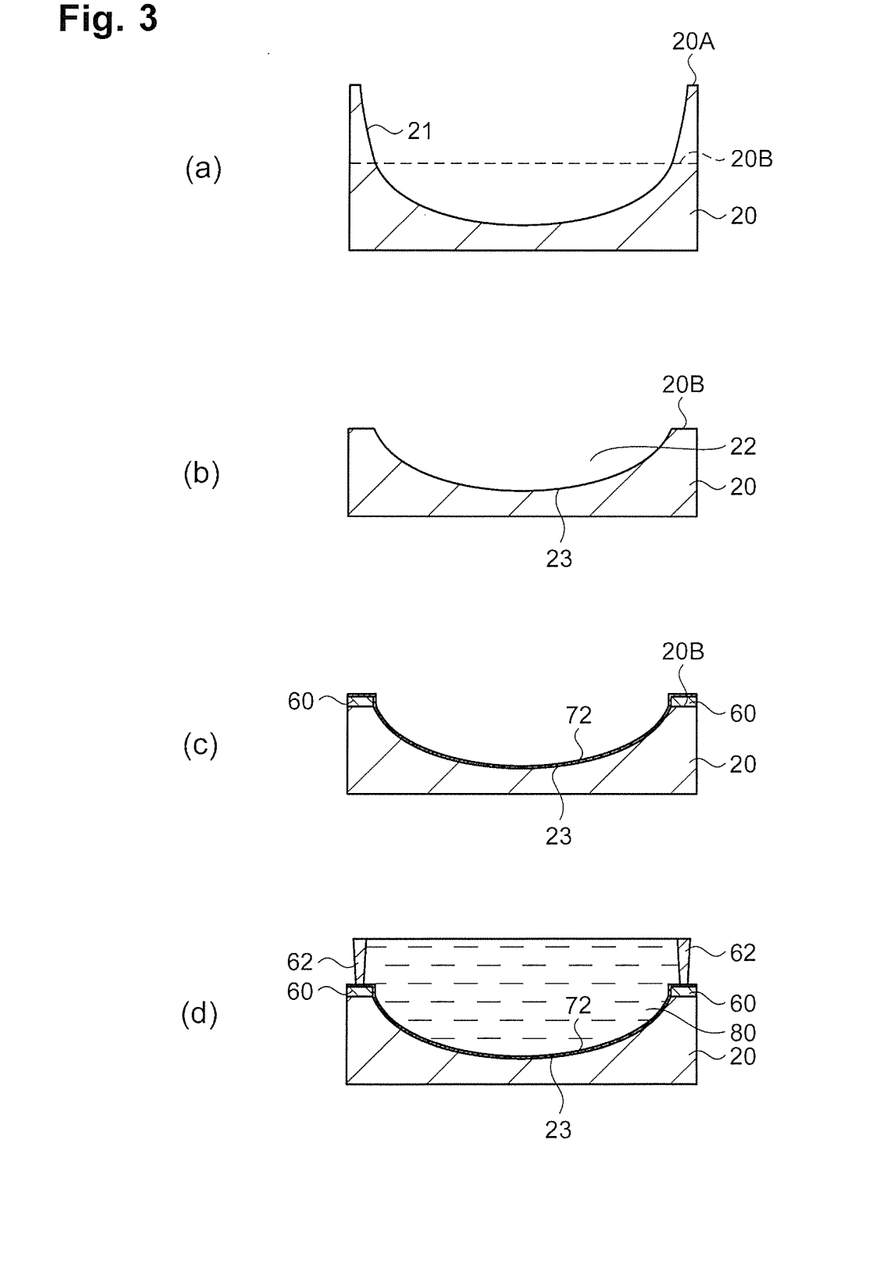
FIG. 3 includes a series of schematic views detailing a manufacturing method for the thermal detector.

Next, the method for producing the thermal detector 10A will be described with reference to FIG. 3. FIG. 3 is a schematic diagram for describing the manufacturing method for the thermal detector.

(1) Isotropic Etching Step

First, as shown in FIG. 3A, a mask layer (not shown) is formed on the surface of the substrate 20, and the substrate 20 is isotropically etched. Isotropic etching of the silicon can be carried out by dry etching or by wet etching using an etching liquid such as hydrochloric acid (HF) or a mixed fluoronitric acid that is composed of hydrofluoric acid (HF) and nitric acid ($HNO_3$). The dry etching method includes a method in which $XeF_2$ etching gas is introduced into the presence of a wafer that is disposed in an etching chamber. Gas etching can be carried out without the need for the etching gas to be excited with plasma. For example, as described in Japanese Laid-Open Patent Application Publication No. 2002-113700, an etching treatment can be carried out with $XeF_2$ at a pressure of 5 kPa. Moreover, $XeF_2$ has a vapor pressure of about 4 Ton, and etching can be carried out at or below the vapor pressure. An etching rate of 3 to 4 μm/min can be expected. Alternatively ICP (inductively coupled plasma) etching may be carried out. For example, a mixed gas of $SF_6$ and $O_2$ may be used, and an RF power of about 100 W can be supplied, with an internal chamber pressure of 1 to 100 Pa. The first recess part 21 having, for example, a hemispherical shape is formed in the substrate 20 by the isotropic etching step described above.

(2) Substrate Processing Step

Next, as shown in FIG. 3(b), the substrate 20 having the first recess part 21 is processed in order to form a second recess part 22 (more broadly, "recess part") that is shallower than the first recess part 21. In this embodiment, the processing step for the substrate 20 involves cutting the level surface 20A (refer to FIG. 3(a)) in which the first recess part 21 opens to the position of the flat surface 20B in the isotropically etched substrate. This processing can be carried out, for example, using chemical mechanical polishing (CMP). As a result, a substrate 20 with a thickness of about 100 μm is formed having a second recess part 22 of the required depth of about 2 μm from the substrate 20 having a thickness of, for example, about 400 μm. In this embodiment, the bottom surface 23 of the second recess part 22 is a spherical surface that is obtained by isotropically etching the substrate 20. The bottom surface 23 of the second recess part 22 that is obtained by processing the substrate 20 having the first recess part 21 is a spherical surface that is formed by leaving the necessary regions and is more shallow than the first recess part 21, having been formed by cutting away most of the unnecessary spherical surface, as with a hemispherical shape.

(3) Step For Forming Lower Protective Film (Dual-Function Etching Stop Film/Planarizing Film)

Next, as shown in FIG. 3(c), a spacer layer 60 is formed on the flat surface 20B of the substrate 20, and a lower protective film 72 is formed so as to cover the entire region of the surface-side of the substrate 20, in other words, on top of the bottom surface 23 of the second recess part 22, the flat surface 20B, and the spacer layer 60. The spacer layer 60 can be formed, for example, from an insulating film such as $SiO_2$ produced by thermal oxidation of the substrate 20. The lower protective film 72 can be formed from SiN film, $SiO_2$ film, or the like, at a thickness of about 0.2 μm.

(4) Step For Forming Sacrificial Layer And The Like

Next, as shown in FIG. 3(d), a sacrificial layer 80 and a post 62 are formed on the substrate 20. First, a sacrificial layer 80 is formed on the lower protective film 72. When SiN that functions as a stopper film during etching of the sacrificial layer 80 is used as the material for the lower protective film 72, then $SiO_2$, for example, can be used as the material for the sacrificial layer 80 which has higher selectivity than SiN with respect to the prescribed etchant.

The selectivity denotes the ratio of the etching rates of a film that is readily etched and a film that is not readily etched.

After planarizing the surface of the sacrificial layer 80 and producing holes for forming the posts 62, the posts 62 are formed by embedding. The post 62 can be a single-layer structure that is found from an aluminum compound ($AlO_x$) such as alumina ($Al_2O_3$) or a two-layer structure in which the outer layer is $Al_2O_3$, and the inner layer is $SiO_2$. The height of the posts 62 is, for example, about 2 μm.

(5) Step For Forming Light-Absorbing Part And The Like

Figure 4:
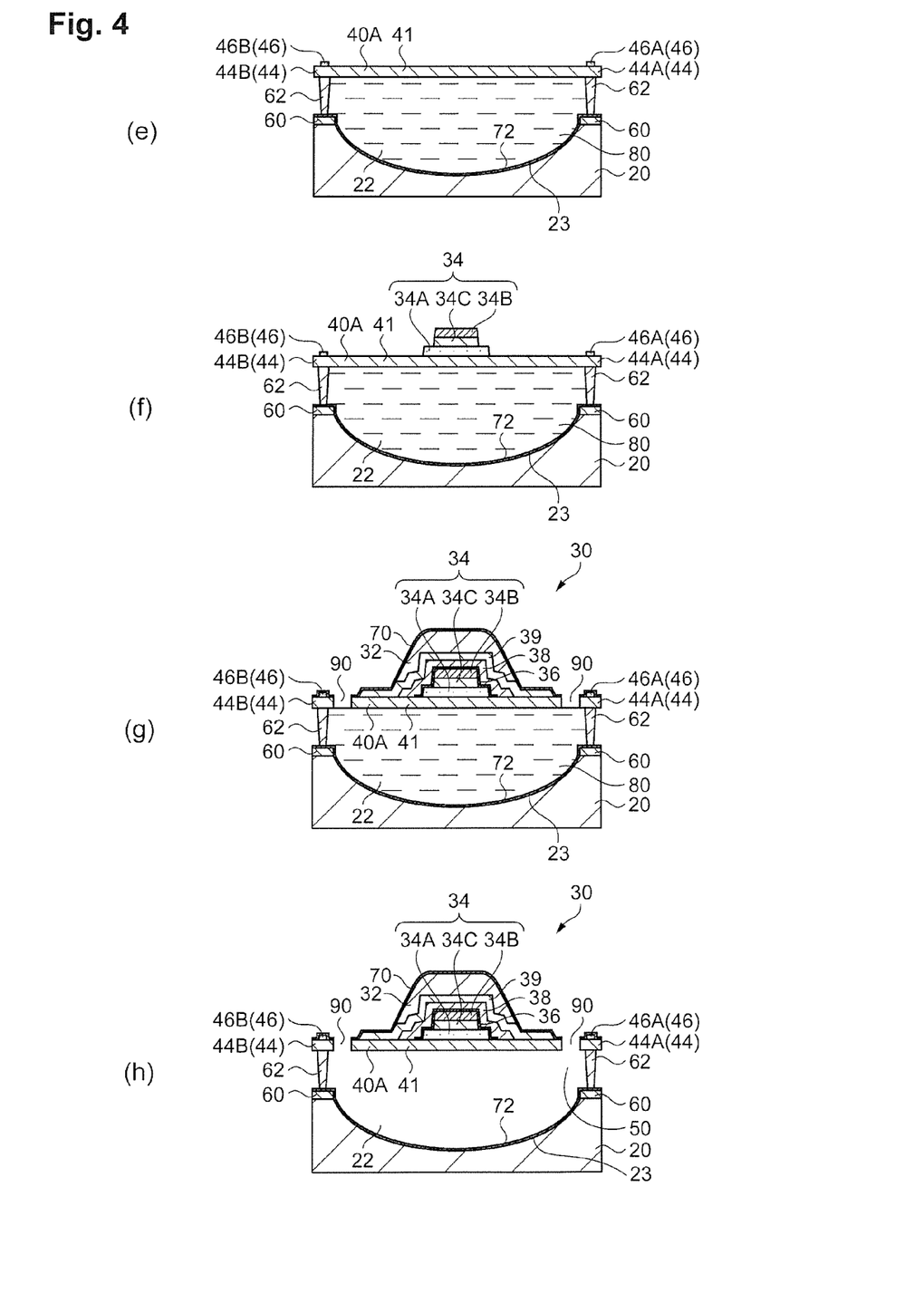
FIG. 4 includes a series of schematic views detailing a manufacturing method for the thermal detector.

Next, as shown in FIG. 4(e), a support layer 40A is formed that will serve as the base for the support member 40 on the sacrificial layer 80. The support layer 40A is formed with a thickness of, for example, about 1 μm from, for example, polycrystalline silicon. The support layer 40A is formed over the entire surface of the sacrificial layer 80 and is unpatterned at this point.

Next, impurity-doping is performed at a predetermined location on the support member 40 at which the light-absorbing part 41 is to be formed. The impurities refer to a material that disrupts the arrangement of the silicon crystal, e.g., boron (B), or phosphorus (P).

A wiring layer 46 is formed on the support layer 40A. At this point, the arm 44 is not patterned and is in the form of the support layer 40A. Next, the wiring layer 46 on the mounting member 42 and the wiring layer 46 on the arm 44 are formed in this step. The wiring layer 46 includes a material that will connect with the first electrode 34A and the second electrode 34B that will be formed later. The wiring that connects with the first electrode 34A which is the lower electrode is also formed in this step. These wiring layers 46 can be formed from a metal such as a Ti/TiN layer or an Al layer, but it is preferable for them to be formed from a transparent electrode (ITO) in order to ensure transmissivity as described above. After the wiring layer 46 has been formed, for example, at a thickness of about 0.2 μm, patterning is carried out using photolithography.

(6) Step For Forming Infrared Detection Element Capacitor

Next, as shown in FIG. 4(f), a thermal detection element 30 is formed in the region corresponding to the mounting member 42 in the support layer 40A. In this embodiment, because the thermal detection element 30 is a pyroelectric-type detecting element, the light-absorbing film 32 and the capacitor 34 (pyroelectric-type detecting element) are formed. The capacitor 34 is formed in the region corresponding to the mounting member 42.

First, the first electrode 34A is formed. Next, the ferroelectric film 34C is layered over the first electrode 34A. Next, the second electrode 34B is layered over the ferroelectric film 34C. There is accordingly formed the capacitor 34 that has a structure in which the ferroelectric film 34C is layered in between the first electrode 34A and the second electrode 34B.

The first electrode 34A and the second electrode 34B can have a three-layer structure of iridium (IR), iridium oxide ($IrO_x$) and platinum (Pt) that are formed by sequential sputtering, for example, from the location farthest from the ferroelectric film 34C. $TiAlN_3$ (titanium aluminum nitride) can be provided as the base layer for the first electrode 34A.

The ferroelectric film 34C can be filmed using a pyroelectric material, for example, PZT (Pb(Zi, Ti)$O_3$, lead zirconate titanate) using a sol-gel method, sputtering, MOCVD, or the like. The first electrode 34A and the second electrode 34B each have film thicknesses of about 0.4 μm, and the ferroelectric film 34C has a film thickness of, for example, about 0.1 μm.

(7) Step For Forming Light-Absorbing Film And Upper Protective Film

Next, as shown in FIG. 4(g), the side surfaces and top surface of the capacitor 34 are covered, for example, by forming a hydrogen barrier film 36 and an electrical insulating film 38. The hydrogen barrier film 36 is formed by sputtering, CVD, or another technique from an aluminum oxide ($AlO_x$) such as alumina ($Al_2O_3$). The electrical insulating film 38 electrically insulates the capacitor 34 in order to form a wiring layer 46A that connects with the second electrode 34B of the capacitor 34. Although not shown, a contact hole is formed on the top surface of the electrically insulating film 38 and the hydrogen barrier film 36. A plug is embedded in this contact hole, and the wiring layer 46A that is formed on the electrically insulating film 38 connects with this plug. The wiring layers 46A and 46B may be formed after formation of the electrically insulating film 38.

Moreover, the protective film 39 is formed over the electrically insulating film 38 and the mounting member 42. The protective film 39 can be formed, for example, from SiN or another material using sputtering or vapor deposition. Next, the light-absorbing film 32 is formed over the protective film 39. The light-absorbing film 32 can be formed, for example, at a film thickness of about 2 μm from a material such as $SiO_2$, SiN, SiCN, or TiN.

Subsequently, the upper protective film 70 is formed over the entire surface of the thermal detector 10A, including the light-absorbing film 32, the electrically insulating film 38, the support layer 40A, and the wiring layer 46. The upper protective film 70 is formed from SiN, for example, at a film thickness of about 0.2 μm as with the lower protective film 72.

(8) Step for Sputtering Support Member and for Forming Thermal Isolation Hollow Next, the support layer 40A is patterned to form the mounting member 42 and the support member 40 having the first arm 44A and the second arm 44B. This step is carried out by anisotropic etching of the material that was used for the support layer 40A, for example, SiN. This anisotropic etching can be realized by covering the mounting member 42 and the region in which the first arm 44A and second arm 44B are to be formed with a mask layer, then using an etching gas produced by adding nitrogen to a mixed gas of fluorine and oxygen or an etching gas produced by adding nitrogen or chlorine to a mixed gas of $CF_4$ and oxygen (e.g., refer to Japanese Laid-Open Patent Application Publication No. 10-261616).

As a result of this anisotropic etching, an opening 90 that exposes the underlying sacrificial layer 80 is formed in locations other than the mounting member 42, the first arm 44A, and the second arm 44B.

As shown in FIG. 4(h), lastly, the entire opening including the opening 90 is utilized as an etching hole through which the etching medium passes, and the underlying sacrificial layer 80 is removed by isotropic etching. This isotropic etching can be carried out by wet etching using hydrofluoric acid (HF). At this time, the surface of the thermal detector 10A, with the exception of the etching hole, is covered with the upper protective film 70 (e.g., SiN), and so the upper protective film 70 can be used as a mask layer during isotropic etching. Moreover, because the lower protective film 72 (e.g., SiN) is formed on the bottom surface 23 of at least the second recess part 22 of the substrate 20, the lower protective film 72 is utilized as an etching stopper film for isotropic etching.

As described above, the following effects can be obtained using the thermal detector 10A of this embodiment.

(1) In accordance with this embodiment, the light that has not been absorbed by the light-absorbing film 32 is reflected by the curved light-reflecting surface 24 and is incident on the light-absorbing part 41 of the support member 40, thereby efficiently conducting it to the light-absorbing film. Consequently, the detection sensitivity of the thermal detector 10A can be increased.

(2) In accordance with this embodiment, impurities are doped into the light-absorbing part 41 of the support member 40. Consequently, the light-absorbing part 41 absorbs light and is readily heated. Consequently, the detection sensitivity of the thermal detector 10A can be increased.

Embodiment 2

A characteristic thermal detector according to a second embodiment is described below using FIGS. 5 and 6. In this embodiment, the same designations are used for similar members or regions as in Embodiment 1, and detailed descriptions are not provided.

With this embodiment, in contrast to Embodiment 1, the light-absorbing part 41 has doped regions in which impurities have been dispersed into polycrystalline silicon and undoped regions that contain no impurities.

Figure 5A:
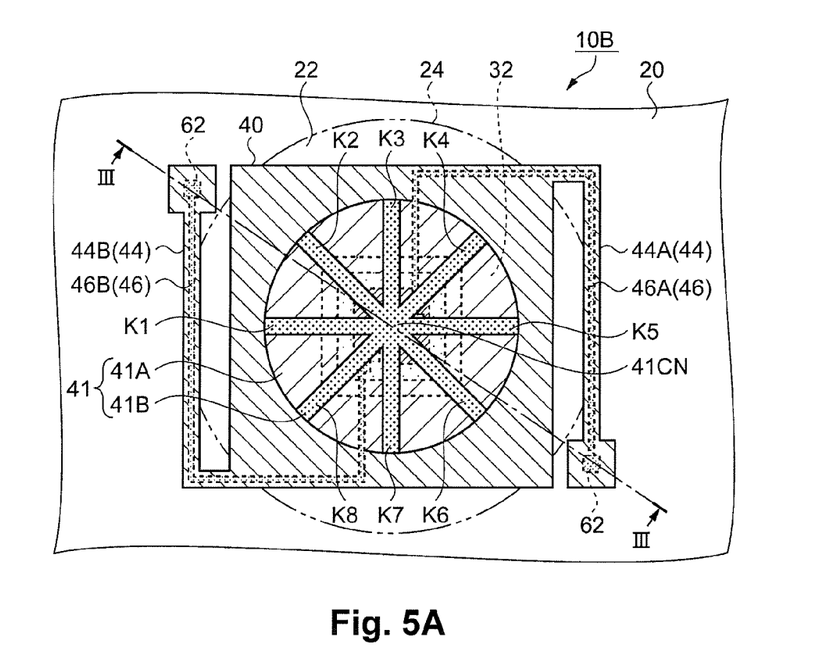
FIG. 5A is a schematic plan view of the thermal detector of Embodiment 2.

FIG. 5A is a schematic plan view of the thermal detector as viewed from the support member 40 towards the substrate 20. FIG. 5B is a schematic sectional view of the thermal detector sectioned along line III-III in FIG. 5A. The thermal detector 10B shows a single cell. First, the general structure of the thermal detector 10B that serves as the infrared detector will be described.

Figure 5B:
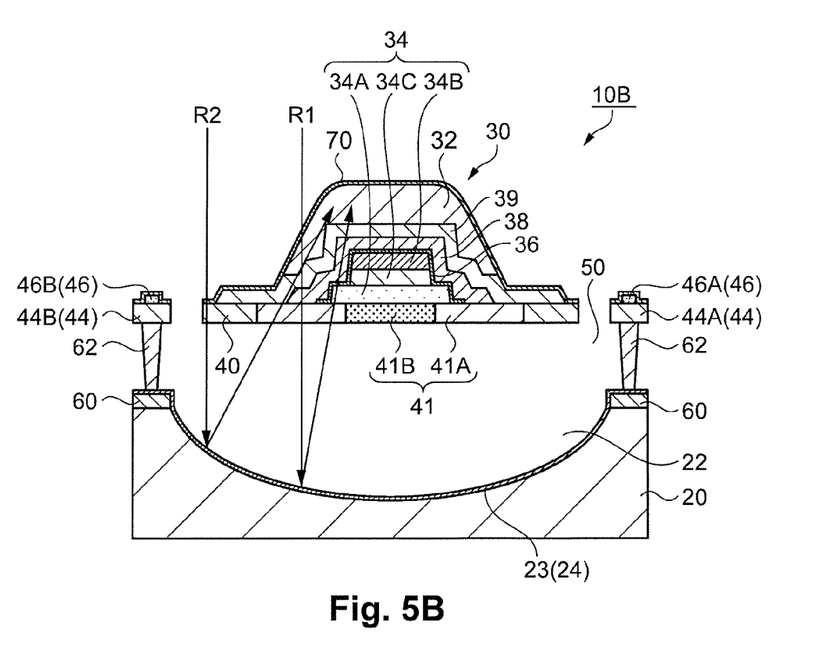
FIG. 5B is a schematic sectional view of the thermal detector of Embodiment 2.

As shown in FIG. 5, the doped regions 41A and the undoped regions 41B in the light-absorbing part 41 are in a patterned layout. The doped regions 41A are locations doped with impurities, and the undoped regions 41B are undoped locations. The impurities are materials that disrupt the arrangement of silicon crystals, for example, boron (B), and phosphorus (P). Light absorption is high and thermal conductivity is low in the doped regions 41A, whereas the light absorption is low and thermal conductivity is high in the undoped regions 41B. Thus, patterning is carried out so that the heat that is generated by light absorption in the doped regions 41A passes through the undoped regions 41B and is conveyed to the thermal detection element 30. As a result, the heat that is generated in the doped regions 41A is efficiently conveyed to the thermal detection element 30, thereby allowing the detection sensitivity of the thermal detector to be increased.

In this manner, the heat that has been generated by absorption of the infrared light R1, R2, and the like in the doped regions 41A of the support member 40 is thermally transferred to the thermal detection element 30 by being transferred to the undoped regions 41B that are on the interior as seen in plan view. Because the undoped regions 41B have high thermal conductivity, they can better transfer heat to the thermal detection element 30 without loss in comparison to Embodiment 1. As a result, the detection sensitivity of the thermal detector 10B can be increased.

With the thermal detector 10B, as seen in plan view, there is adopted a radial pattern in which eight protrusions (K1 to K8) that protrude to the circumference are provided about a center part 41CN of the thermal detection element 30. However, this pattern is provided merely as an example, and not by way of limitation to the invention.

By utilizing this type of pattern, the heat that has been generated by the ultraviolet light that has been absorbed in the undoped regions of the light-absorbing part 41 is efficiently transferred via the undoped regions 41 B to the capacitor 34 used as the heat detection element. Because the doped regions 41A are formed to be larger than the capacitor 34 as seen in plan view, a large amount of heat is generated in the doped regions 41A. As a result, heat can be efficiently transferred to the capacitor 34 by the undoped regions 41B, regardless of where it is generated. Thus, for example, even heat generated in locations that are distant from the capacitor 34 can be efficiently collected in the capacitor 34 via the undoped region 41B.

Figure 6A:
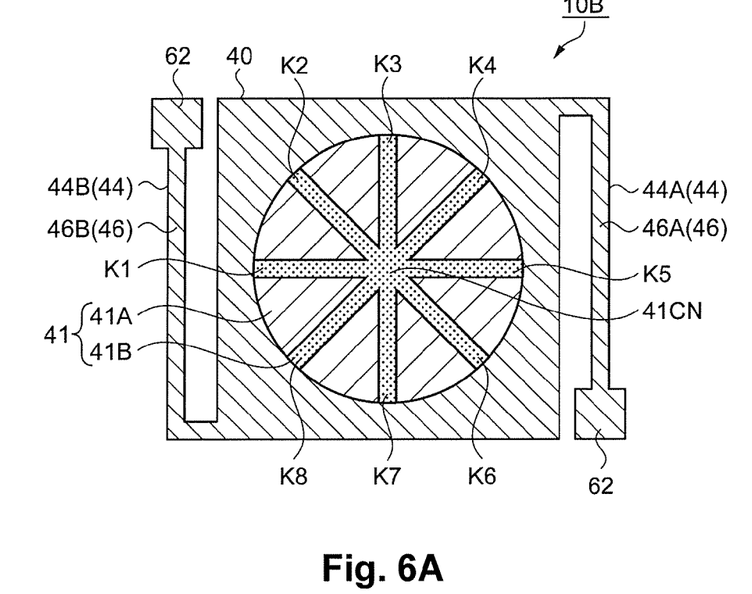
FIGS. 6A and 6B are diagrams showing examples of the pattern of the undoped region.
Figure 6B:
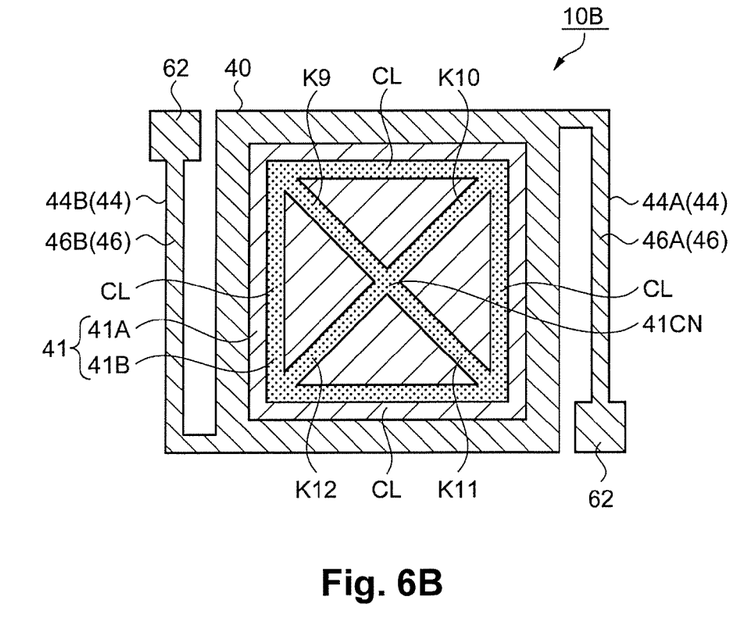

FIG. 6A and FIG. 6B are diagrams showing examples of patterns for the undoped region 41B. The capacitor 34 and the second recess part 22 have been left out. In the example shown in FIG. 6A, the same example is presented as in FIG. 5. Specifically, the undoped region 41B has a radial pattern in which eight protrusions K1 to K8 that protrude to the circumference (in eight directions) are provided about a center part 41 CN of the capacitor 34 as seen in plan view. The protrusions K1 to K8, as seen in plan view, extend past the region in which the capacitor 34 that is used as the thermal-type detecting element is provided. As a result, even heat that is generated in locations that are distant from the capacitor 34 can be efficiently transferred to the capacitor 34 via the protrusions K1 to K8 in the undoped regions 41B.

Moreover, the shape in which the plurality of protrusions K1 to K8 are provided may have point symmetry about the center part 41CN of the capacitor 34, as seen in plan view. Specifically, the undoped regions 41B, as seen in plan view, may have a point-symmetrical pattern about the center part 41CN of the capacitor 34.

FIG. 6B is a diagram showing another example of the pattern of the undoped region 41B. In the example shown in FIG. 6B, the undoped region 41B has a pattern in which are combined a ring-shaped pattern CL and a pattern having a plurality of protrusions K9, K10, K11, and K12. Specifically, the undoped regions 41B, as seen in plan view, have an X-shaped pattern in which are provided protrusions K9, K10, K11, and K12 that are formed so as to protrude radially (in four directions) about the center part 41CN of the capacitor 34, along with a ring-shaped part CL (in this case, a roughly square-shaped ring part) that is provided so that it connects in common with the distal edges of the protrusions K9, K10, K11, and K12. This ring-shaped part CL, as seen in plan view, is arranged so as to encompass the center part 41CN.

As a result of providing the ring-shaped part CL, in particular, the heat that is generated in the region surrounding the capacitor 34, specifically, the surrounding regions that are separated at a distance from the capacitor 34, can be efficiently collected in the capacitor 34 by the ring-shaped part CL.

Moreover, protrusions K9, K10, K11, and K12 are present along with part of the ring-shaped part CL in the light-absorbing part 41. These protrusions K9, K10, K11, and K12 are connected with the center part 41CN of the undoped region 41B. Thus, the heat that is generated at the periphery can be effectively transferred to the capacitor 34 via the ring-shaped part CL, the protrusions K9, K10, K11, and K12, and the center part 41CN. In the example of FIG. 6B, the four protrusions K9 to K12 are formed in the shape of an X. The resulting effects are similar to those of the example of FIG. 6A.

As described above, the following effects can be obtained with the thermal detector 10B according to this embodiment.

(1) In accordance with this embodiment, the light-absorbing part 41 has a pattern of doped regions 41A and undoped regions 41B. Light is absorbed at the doped region 41A and heat is generated, and the heat can be conveyed to the capacitor 34 by the undoped regions 41B. In this manner, the heat that has been generated at the doped regions 41A is efficiently conveyed to the capacitor 34, and the detection sensitivity of the thermal detector 10B can be increased.

Embodiment 3

Next, a characteristic thermal detector according to Embodiment 3 will be described with reference to FIGS. 7 to 10. In this embodiment, the same designations are used for similar members or regions as in Embodiment 1, and detailed descriptions are not provided.

Figure 7:
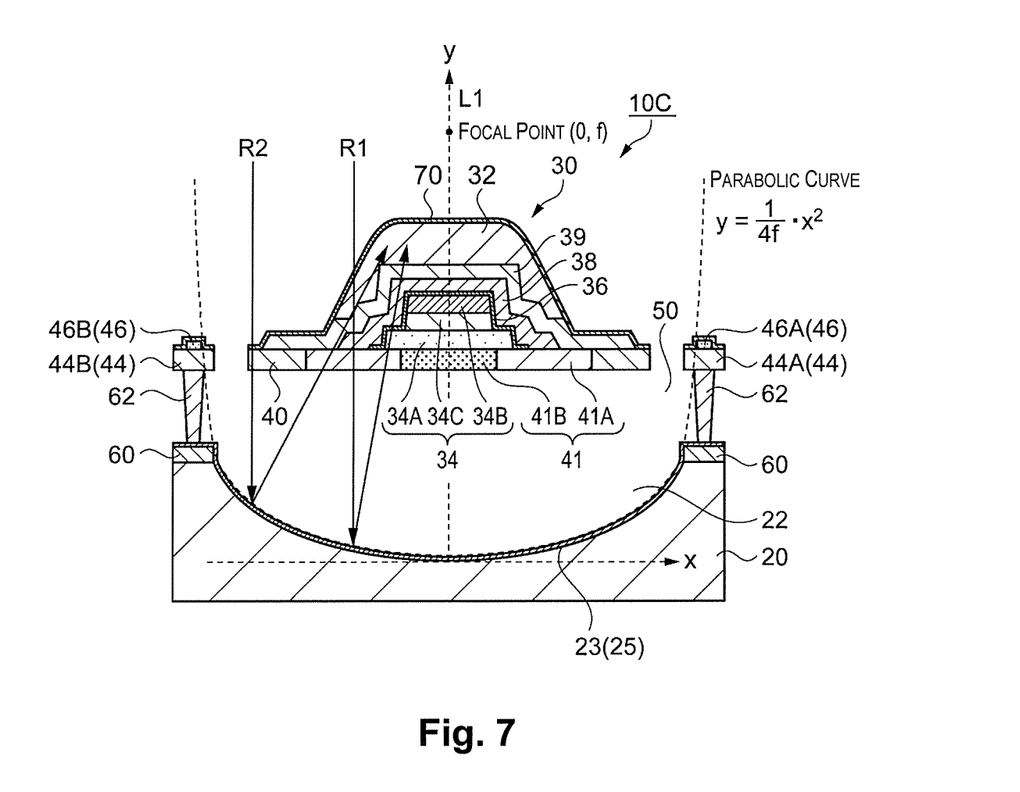
FIG. 7 is a schematic sectional view showing an infrared detector according to Embodiment 3.

This embodiment differs from Embodiment 1 insofar as the shape of the curved light-reflecting surface 24 is different.

Figure 8A:
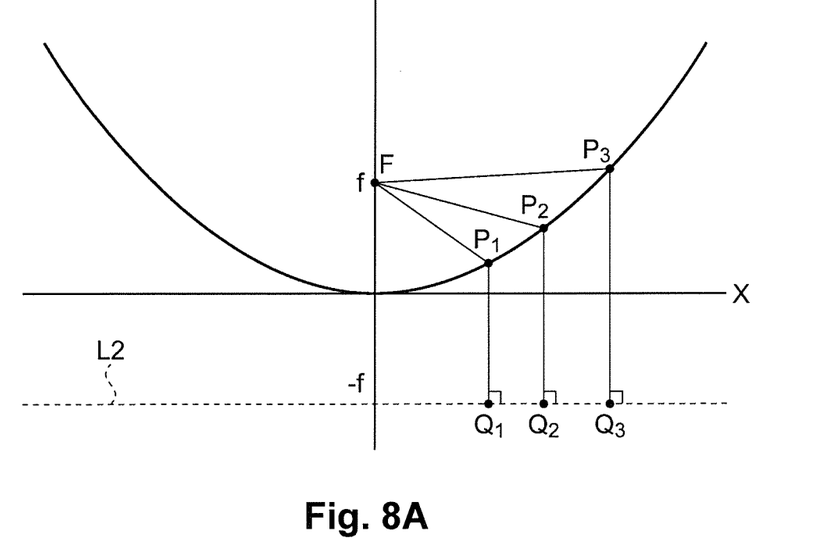
FIGS. 8A and 8B are diagrams detailing the parabolic surface.
Figure 8B:
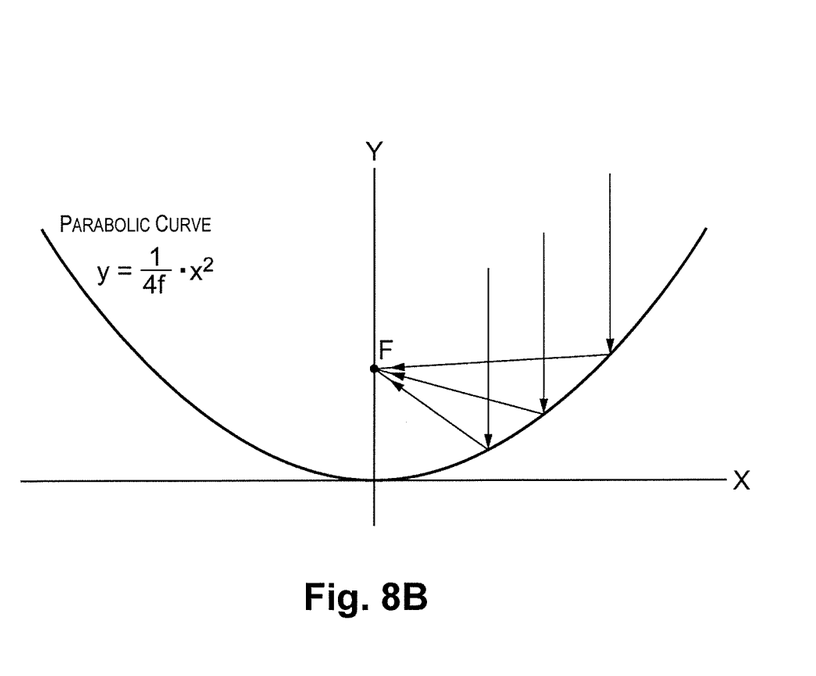

FIG. 7 is a schematic sectional view showing the infrared detector, and FIG. 8 is a diagram detailing a parabolic surface. In FIG. 7, the bottom surface 23 of the second recess part 22 in the thermal detector 10C is a parabolic surface, not a spherical surface. As shown in FIG. 8A, given a reference line L2 (y=−f) that is parallel to the X axis and perpendicular to the Y axis and a focal point F (y=f) on the Y-axis, the parabolic curve that forms the parabolic surface is given as the locus of points P for which points Q exist on the reference line L2 such that the distance PQ is equivalent to the distance PF from point P to the focal point F.

The locus of points P (x, y) is described as follows based on the Pythagorean theorem for a right triangle FPR, taking R as the intersection of the Y-axis with a vertical line running from point P down to the Y-axis.

$$(y+f)^2 = x^2 + (f-y)^2 \qquad (1)$$

Rearranging formula (1) gives the following relationship for the parabolic line formed by points P (x, y) with x,y origin (0, 0) as the apex.

$$y = x^2/4f$$

As shown in FIG. 8B, the light that is incident parallel to the Y-axis is thus reflected at the parabolic surface and focused at focal point F of the parabolic surface.

In this embodiment, as shown in FIG. 7, the line that passes through the center as seen in plan view of the thermal detection element 30 is taken as the Y axis, and the XY plane is set taking the point at which the bottom surface 23 of the second recess part 22 and the Y axis intersect as the origin (0, 0). Thus, the curved light-reflecting surface 25 of the bottom surface 23 constitutes a parabolic surface with the origin (0, 0) as the apex. Thus, the curved light-reflecting surface 25 is provided so that the focal point F (0, f) of the curved light-reflecting surface 25 is in a location that is situated towards the light-incidence side from the light-absorbing film 32. Because the reflected light from the curved light-reflecting surface 25 is focused at the focal point F (0, f), infrared light can be efficiently absorbed in the doped regions along the incidence path of the reflected light. The value of f has no particular restrictions, but is set at, for example, approximately 2 to 10 μm in this embodiment.

Infrared Detector Manufacturing Method

Figure 9:
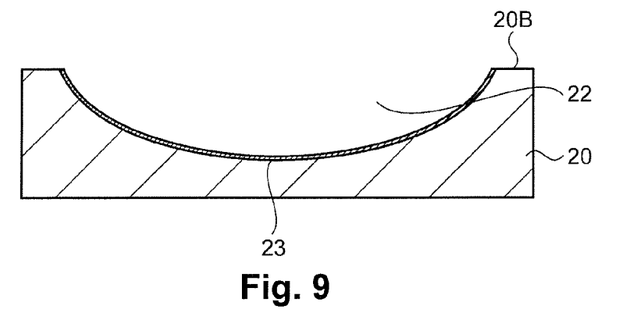
FIG. 9 is a schematic diagram detailing a manufacturing method for the infrared detector.

The manufacturing method of this embodiment will be described with reference to FIGS. 9 and 10. FIGS. 9 and 10 are schematic diagrams used for describing the method for producing the infrared detector. The manufacturing method of this embodiment is different from Embodiment 1 in regard to the isotropic etching step and the substrate processing step in the first embodiment. The other steps are substantially identical with Embodiment 1 and descriptions are not presented.

As shown in FIG. 9, the bottom surface 23 of the second recess part 22 of the substrate 20 is formed as the aforementioned parabolic surface or as the curved surface of the first embodiment that is closer to a parabolic surface than a spherical surface. An example of the step for forming the second recess part 22 is described with reference to FIGS. 10A to 10D.

FIGS. 10A to 10D show an isotropic etching step referred to as time-multiplexed plasma etching. This time-multiplexed plasma etching is described in K. Wang, K. F. Bohringer, "Time-multiplexed plasma-etching of high numerical aperture paraboloidal micromirror arrays," CLEO/Pacific Rom 2003. 15-19 Dec. 2003. Vol. 1, p. 317.

Figure 10A:
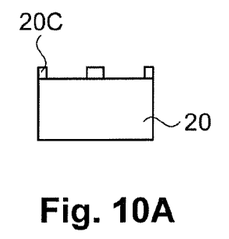
FIGS. 10A to 10D are schematic diagrams detailing a manufacturing method for the infrared detector.
Figure 10B:
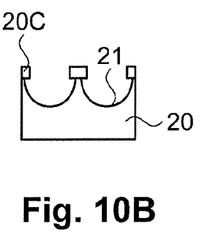
Figure 10C:
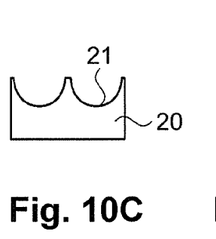
Figure 10D:
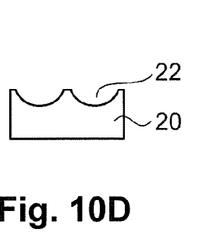

First, as shown in FIG. 10A, a mask layer 20C is formed on the substrate 20. Next, as shown in FIG. 10B, isotropic etching is carried out for 35 min using, for example, $SF_6$ plasma to obtain a first recess part 21. Next, as shown in FIG. 10C, the mask layer 20C is removed, and the substrate 20 is isotropically etched with the mask layer 20C absent for 15 min longer using, for example, $SF_6$ plasma. As a result, a second recess part 22 is obtained as shown in FIG. 10D. The second recess part 22 is obtained by additionally processing the substrate 20 having the first recess part 21 that was obtained by the isotropic etching step. Consequently, the second recess part 22 is shallower in depth than the first recess part 21, and may be a curved surface that is a parabolic surface or closer to a parabolic surface than a spherical surface.

As described above, the following effects can be obtained in accordance with the thermal detector 10C of this embodiment.

(1) In accordance with this embodiment, the curved light-reflecting surface 25 is a parabolic surface or a curved surface that is closer to a parabolic surface than a spherical surface. The light that is reflected at this parabolic surface passes through the focal point which is necessarily a single point. The light that reflects at a spherical surface also passes through a location that is close to a prescribed point. Consequently, the curved light-reflecting surface 25 can be provided so that the reflected light that arrives from the opposite side from the light incidence direction passes through the light-absorbing part 41. As a result, the amount of light that is absorbed by the light-absorbing part 41 is increased, which increases the amount of heat generated due to the incident light, allowing the detection sensitivity of the thermal detector 10C to be increased.

Embodiment 4

Figure 11:
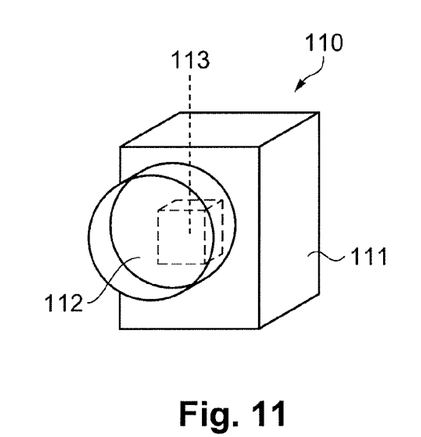
FIG. 11 is a general perspective view showing the configuration of the thermographic device according to Embodiment 4.

Next, a thermographic device will be described as the electronic instrument that is used as an example in which the infrared detection device 1 is used. FIG. 11 is a general perspective view showing the configuration of the thermographic device. As shown in FIG. 11, the thermographic device 110 that serves as an electronic instrument has an exterior part 111 and a lens part 112. The image capture part 113 that is sensitive to infrared light is provided inside the exterior part 111, and the infrared detection device 1 is used in the image capture part 113.

As described above, the following effects are obtained with the thermographic device 110 according to this embodiment.

(1) In accordance with this embodiment, the thermographic device 110 has an infrared detection device 1, and this infrared detection device 1 has high detection sensitivity, which allows the thermographic device 110 to output a light distribution image with favorable sensitivity.

A number of embodiments were described above, but as will be readily appreciated by a person skilled in the art, numerous modifications can be made provided that they do not deviate substantially from the novel matter and effect of the invention. Consequently, examples of such modifications are included within the scope of the invention. For example, in the specification or drawings, in at least one instance, terms that are presented along with different terms that have a broader meaning or the same meaning may be replaced with these different terms in some locations.

The present invention is not restricted to the embodiments described above; various modifications and improvements may be included. Modification examples are described below.

Modification Example 1

In Embodiment 1, the thermal detector 10A is a pyroelectric-type device, but the invention may also be used in a bolometer-type thermal detector. In this case as well, detection is possible with favorable sensitivity.

Modification Example 2

In Embodiment 1, the thermal detector 10A is a sensor for detecting infrared light, but the target of detection is not restricted to infrared light. The light may also be light of a wavelength range other than infrared, such as terahertz light. In this case as well, detection is possible with favorable sensitivity.

Modification Example 3

In Embodiment 4, an example is presented in which the infrared detection device 1 is mounted in a thermographic device 110. In addition to a thermographic device, the infrared detection device 1 may be mounted in an electronic instrument such as a vehicle-mounted night vision device or a surveillance camera.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A thermal detector comprising:
a substrate having a recess part with a bottom surface of the recess part being a curved light-reflecting surface;
a thermal detection element having a light-absorbing film; and
a support member supporting the thermal detection element, the substrate and the support member being arranged to form a hollow part therebetween, and
the support member including a light-absorbing part in which impurities are dispersed in polycrystalline silicon with the light-absorbing part being arranged in at least a part of a surface of the support member facing toward the hollow part so that the light-absorbing part is irradiated by light reflected by the curved light-reflecting surface.

2. The thermal detector according to claim 1, wherein the light-absorbing part has a pattern including a doped region in which the impurities are dispersed in the polycrystalline silicon and an undoped region that is free from impurities.

3. The thermal detector according to claim 1, wherein the curved light-reflecting surface is a spherical surface, a parabolic surface, or a curved surface that is closer to the parabolic surface than the spherical surface.

4. A thermal detection device comprising:
a plurality of the thermal detectors according to claim 1 arranged two-dimensionally in a grid-like pattern.

5. An electronic instrument including the thermal detection device according to claim 4.

6. The thermal detector according to claim 1, wherein the thermal detector is configured and arranged to detect infrared light.

7. The thermal detector according to claim 1, wherein the thermal detector is configured and arranged to detect terahertz light.

* * * * *